United States Patent [19]
Watanabe et al.

[11] 3,949,306
[45] Apr. 6, 1976

[54] HIGH FREQUENCY AMPLIFIER WITH FREQUENCY CONVERSION

[75] Inventors: Seiichi Watanabe, Machida; Takashi Yoshikawa, Fujisawa, both of Japan

[73] Assignee: Sony Corporation, Tokyo, Japan

[22] Filed: Jan. 30, 1975

[21] Appl. No.: 545,755

Related U.S. Application Data
[62] Division of Ser. No. 407,604, Oct. 18, 1973, Pat. No. 3,886,467.

[30] Foreign Application Priority Data
Nov. 2, 1972  Japan............................ 47-127021

[52] U.S. Cl................................. 325/451; 330/21
[51] Int. Cl.². ........................................... H04B 1/28
[58] Field of Search.................... 325/438, 439, 451

[56] References Cited
UNITED STATES PATENTS
3,694,756  9/1972  Carlson.............................. 325/451

Primary Examiner—R. V. Rolinec
Assistant Examiner—Lawrence J. Dahl
Attorney, Agent, or Firm—Lewis H. Eslinger; Alvin Sinderbrand

[57] ABSTRACT

A high frequency amplifier comprising an amplifying circuit, an emitter follower which makes the output impedance of the amplifying circuit low and an impedance matching network consisting of a coil and a condenser and connected between the amplifying circuit and the emitter follower, in which an operation voltage for the amplifying circuit is supplied thereto through a bias resistor for the emitter follower and a coil of the impedance matching network.

2 Claims, 3 Drawing Figures

HIGH FREQUENCY AMPLIFIER WITH FREQUENCY CONVERSION

This is a division of application Ser. No. 407,604, filed Oct. 18, 1973, now U.S. Pat. No. 3,886,467.

BACKGROUND OF THE INVENTION

1. Field of the Invention

This invention relates generally to a high frequency amplifier, and more particularly to a high frequency amplifier with a low output impedance.

2. Description of the Prior Art

In a prior art high frequency amplifier, a resonance circuit consisting of a coil and a condenser is connected to the output terminal of a transistor for amplifying and an amplified signal is derived from the resonance circuit.

When another circuit with low input impedance is connected to the high frequency amplifier, it is necessary that a secondary coil is provided in connection with the coil of the resonance circuit to convert the output impedance of the high frequency amplifier to a low impedance.

The prior art high frequency amplifier with the construction mentioned above has the following defect. That is, the resonance frequency of the resonance circuit in the amplifier varies in accordance with the change of an input impedance of a circuit which may be connected to the following stage of the high frequency amplifier.

Further, in the case where the amplifier is formed as an integrated circuit, Q of the resonance circuit is lowered, so that a sufficient selectivity can not be obtained.

Further, due to the impedance conversion, a secondary coil is required for the resonance circuit which is unsuitable when it is formed as an integrated circuit.

SUMMARY OF THE INVENTION

A high frequency amplifier of this invention comprises an amplifying circuit and an emitter follower which makes the output impedance of the amplifying circuit low.

An impedance matching network consisting of a coil and a condenser is connected between the amplifying circuit and the emitter follower, and an operation voltage for the amplifying circuit is supplied through a bias resistor for the emitter follower and the coil of the impedance matching network.

It is an object of this invention to provide a high frequency amplifier which does not require the frequency adjustment of a resonance circuit.

Another object of this invention is to provide a high frequency amplifier which is suitable for being formed on a single semiconductor wafer as an integrated circuit.

A further object of this invention is to provide a high frequency amplifier which is simple in construction.

Still another object of this invention is to provide a converting circuit which can reject an undesirable signal.

DESCRIPTION OF THE PREFERRED EMBODIMENTS

Figure 1:
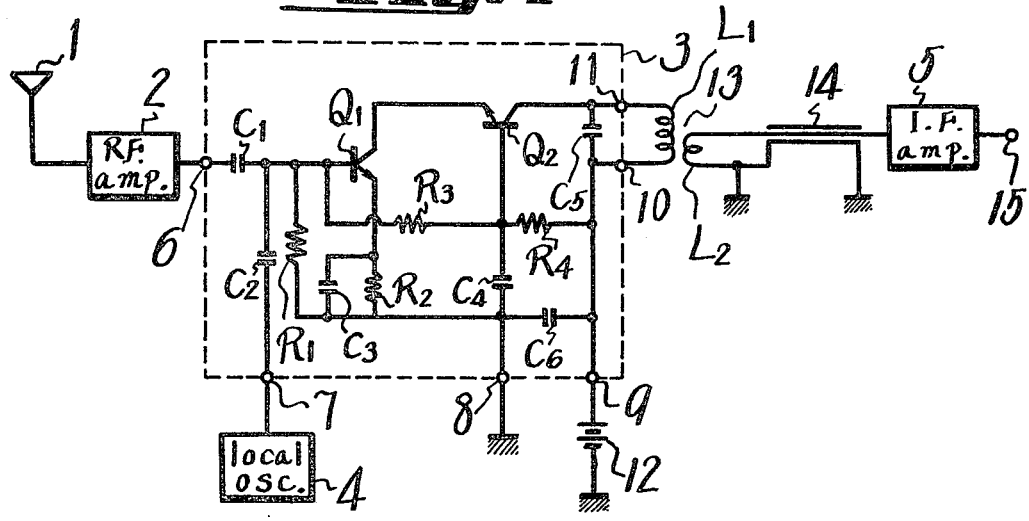
FIG. 1 shows a schematic circuit diagram of a prior art high frequency amplifier.

In order to better understand this invention, an example of a prior art high frequency amplifier for a television receiver will be now described with reference to FIG. 1.

In the prior art, a tuner circuit consists of an RF amplifier 2, a converting circuit 3 and a local oscillator 4, mainly. An IF output signal is derived from the converting circuit 3.

A television signal received by an antenna 1 is fed to the RF amplifier 2 to be amplified and then to an RF signal input terminal 6 of the converting circuit 3. The RF signal input terminal 6 is connected through a coupling condenser $C_1$ to the base electrode of a transistor $Q_1$ which operates as a grounded-emitter amplifier. The local oscillation signal from the local oscillator 4 is applied to a local oscillation signal input terminal 7 of the converting circuit 3. The local oscillation signal input terminal 7 is connected through an injecting condenser $C_2$ to the base electrode of the transistor $Q_1$. The base electrode of the transistor $Q_1$ is connected through a resistor $R_1$ to a ground terminal 8 and also through a resistor $R_3$ to the base electrode of a transistor $Q_2$ which may act as a groundedbase amplifier. The emitter electrode of the transistor $Q_1$ is connected to the ground terminal 8 through a parallel circuit of a bypass condenser $C_3$ and a resistor $R_2$, while the collector electrode of the transistor $Q_1$ is connected to the emitter electrode of the transistor $Q_2$. Thus, the transistors $Q_1$ and $Q_2$ form a cascade amplifier. The base electrode of the transistor $Q_2$ is connected through a bypass condenser $C_4$ to the ground terminal 8 and also through a resistor $R_4$ to a power supply terminal 9 of the converting circuit 3 to which a power source 12 is connected, while the collector electrode of the transistor $Q_2$ is connected through a tuning condenser $C_5$ to the power supply terminal 9. The ground terminal 8 is grounded and the power supply terminal 9 is supplied with operating voltage from the power source 12. A primary coil $L_1$ of an IF transformer 13 is connected in parallel to the condenser $C_5$ through terminals 11 and 12 of the converting circuit 3. The condenser $C_5$ and the coil $L_1$ form a parallel resonance circuit and its resonance frequency is selected to be an intermediate frequency and 45.75MHz in the case of U.S. television receiver. The IF signal obtained across a secondary coil $L_2$ of the IF transformer 13 is applied through a coaxial cable 14 to an IF amplifier 5 with low input impedance which is provided remote from the tuner circuit. An IF signal output terminal 15 is led out from the IF amplifier 5.

It is assumed that a television signal of a channel-2 with a frequency of 55.25MHz is received. If the oscillating frequency of the local oscillator 4 is selected to be 101.0MHz, an output signal containing frequency components with 45.75MHz (= 101.0MHz − 55.25MHz), 55.25MHz, 101.0MHz and 156.25MHz (= 101.0MHz + 55.25MHz) can be obtained as an output of the converting circuit 3. Since the resonance frequency of the resonance circuit formed by the IF transformer 13 is selected as 45.75 MHz, if Q of the resonance circuit is high enough, the signal component with the frequency 45.75MHz in the above signal components is only selected and then fed to the IF amplifier 5.

If such a case is considered that the converting circuit 3 circled by a dotted line in FIG. 1 is formed as an integrated circuit, the collector electrode of the transistor $Q_2$ must be formed on one side of a semiconductor wafer similar to its base and emitter electrodes. Accordingly, the output impedance of the converting circuit 3 is lowered, Q of the resonance circuit formed by the IF transformer 13 is also lowered, and hence the frequency pass band of the resonance circuit becomes wide. As a result, an undersirable signal, for example, a signal with the frequency 55.25MHz is passed to the IF amplifier 5 to cause the generation of a beat signal with the frequency 9.5MHz (= 55.25MHz − 45.75MHz) in the IF amplifier 5 which may have a bad influence upon a reproduced picture.

The resonance frequency of the resonance circuit formed by the IF transformer 13 is affected by the variation of the input impedance of the IF amplifier 5 connected to the transformer, so that is is necessary to control or adjust the resonance frequency of the resonance circuit in accordance with the deviation of the input impedance of the IF amplifier 5. Accordingly, in the case where the tuning circuit and the IF amplifier, which are previously manufactured separately, are assembled to construct a televsion receiver as is typical in the manufacture of television receivers, its adjustment requires much time.

An embodiment of the high frequency amplifier according to this invention which is free from the disadvantages of the prior art mentioned above will be hereinbelow described with reference to FIG. 2 in which reference numerals or characters similar to those of FIG. 1 represent similar elements and their description will be omitted for the sake of brevity.

Figure 2:
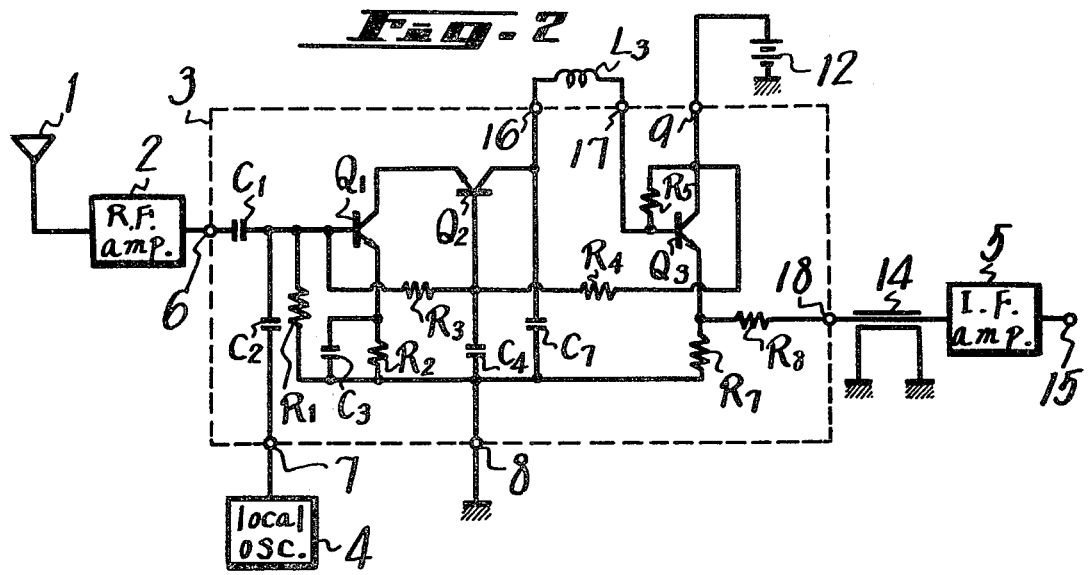
FIG. 2 shows a schematic circuit diagram of an example of the high frequency amplifier according to this invention.

The part surrounded by the dotted-line block 3 in FIG. 2 shows an integrated circuit. The collector electrode of the transistor $Q_2$ which forms with the transistor $Q_1$ a cascade amplifier is connected through a terminal 16, an impedance matching coil $L_3$ and a terminal 17 to the base electrode of a transistor $Q_3$ which forms an emitter follower. The collector electrode of the transistor $Q_3$ is connected to the power supply terminal 9 and also to its base electrode through a resistor $R_5$, while the emitter electrode of the transistor $Q_3$ is connected through a resistor $R_7$ to the ground terminal 8 and also to a terminal 18 through a resistor $R_8$. The resistance value of the resistor $R_7$ is selected to make the gain and signal-to-noise ratio of the emitter current of the transistor $Q_3$ most preferable, for example, 3 kilo-ohms. Further, the output impedance of the emitter follower is very low, so that in order to perform the impedance matching between the coaxial cable 14 which is connected to the terminal 18 and the IF amplifier 5, the resistance value of the resistor $R_7$ is selected equal to the surge impedance of the coaxial cable 14 and to the input impedance of the IF amplifier 5, that is, 75 ohms.

Further, in the embodiment shown in FIG. 2, so as to perform the impedance matching between the output impedance of the cascade amplifier and the input impedance of the emitter follower, an impedance matching network is provided which consists of the coil $L_3$ and a condenser $C_7$. In this case, the coil $L_3$ and the condenser $C_7$ are selected in value such that the impedance viewed from the transistor $Q_2$ to the matching network is equal to the output impedance of the transistor $Q_2$, and the impedance viewed from the transistor $Q_3$ to the matching network is equal to the input impedance of the transistor $Q_3$. That is, the inductance value of the coil $L_3$ is selected, for example, $1.8 \sim 3.0 \mu H$ and the capacitance value of the condenser $C_7$ is selected, for example, $2 \sim 3pF$.

By the provision of the matching network, the output from the transistor $Q_2$ is effectively applied to the transistor $Q_3$. Further, since the matching network serves as a low pass filter, when it is used as a converting circuit an undesirable spurious signal with the high frequency components can be rejected.

Further, operation voltage for the transistors $Q_1$ and $Q_2$ is supplied thereto through the bias resistor $R_5$ of the transistor $Q_3$ and the matching coil $L_3$, so that no choke coil for supplying the operation voltage to the transistor $Q_1$ and $Q_2$ is required and the transistors $Q_1$ and $Q_2$ serve as bias resistors for the transistor $Q_3$ which causes no need of a bias resistor connected between the base electrode of the transistor $Q_3$ and the ground terminal 8. Accordingly, circuit construction inside the integrated circuit and that outside the integrated circuit become simple with the result that the integrated circuit itself and an external circuit can be easily manufactured.

Since the resistance value of the bias resistor $R_5$ is selected relatively low, for example, 430 ohms so as to supply the operation voltage to the transistors $Q_1$ and $Q_2$, the bias resistor $R_5$ acts as a damping resistor for the emitter follower to make the operation of the latter stable.

Further, the output impedance of the converting circuit 3 becomes constant and non-reactive due to the employment of the emitter follower and the matching resistor, so that the frequency characteristics of the converting circuit 3 are prevented from being changed by the influence of the input impedance of the IF amplifier 5.

Figure 3:
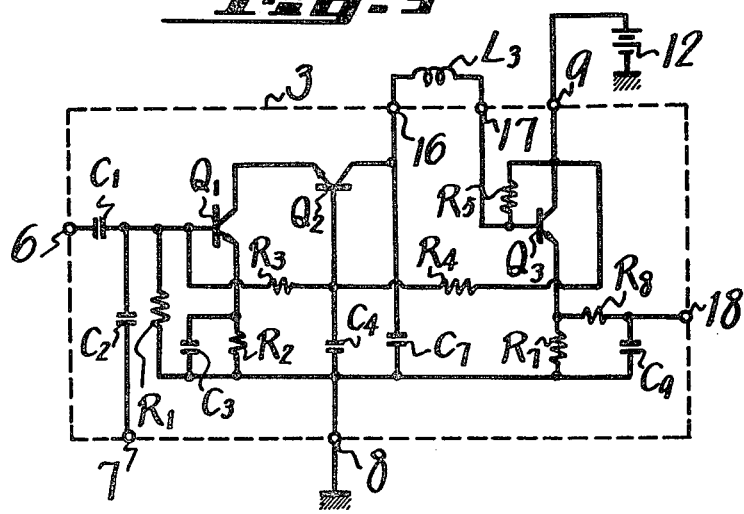
FIG. 3 shows a schematic circuit diagram of another embodiment of the high frequency amplifier according to this invention.

FIG. 3 shows another embodiment of this invention in which same reference numerals and characters as those of FIGS. 1 and 2 represent the same elements and their description will be omitted for the sake of simplicity.

The converting circuit 3 shown in FIG. 3 has provided a condenser $C_9$ which is connected between the terminal 18 and the ground terminal 8 to form a low pass filter together with the matching resistor $R_8$. The capacitance value of the condenser $C_9$ is selected, for example, 8pF to reject an undesirable spurious signal with high frequency components which may be generated in the converting circuit. Accordingly, the embodiment shown in FIG. 3 rejects the spurious signal more positively as compared with that shown in FIG. 2.

The other circuit construction of FIG. 3 is substantially same as that of FIG. 2, so that their description will be omitted.

It will be apparent that many modifications and variations could be effected by those skilled in the art without departing from the spirits and scope of the novel concepts of this invention. Accordingly, the scope of this invention should be determined by the appended claims.

We claim as our invention;
1. A high frequency amplifier comprising:
   a. an amplifying circuit having an input terminal and and intermediate output terminal;
   b. a transistor having collector, emitter and base electrodes connected in the emitter follower con- figuration;
c. a power supply terminal connected to the collector electrode of said transistor;
d. a first resistor connected between said power supply terminal and the base electrode of said transistor;
e. a second resistor connected between the emitter electrode of said transistor and a ground;
f. an output terminal connected to the emitter electrode of said transistor;
g. a third resistor connected between said emitter electrode of said transistor and said output terminal;
h. an impedance matching circuit including a first condenser connected between said intermediate output terminal of said amplifying circuit and said ground and a coil connected between said intermediate output terminal of said amplifying circuit and the base electrode of said transistor, whereby said amplifying circuit and said transistor are connected to each other with proper impedance matching and an operation voltage for said amplifying circuit is supplied from said power supply terminal through said first resistor and said coil;
i. an RF amplifier providing an RF signal; and
j. a local oscillator providing an output which, with said RF signal, is supplied to said input terminal of said amplifying circuit so that the latter acts as a frequency converter.

2. A high frequency amplifier according to claim 1, further comprising a second condenser connected between said output terminal and said ground.

* * * * *